US012652041B2

(12) United States Patent     (10) Patent No.:   US 12,652,041 B2

Qin et al.     (45) Date of Patent:    Jun. 9, 2026

(54) DRIVE CIRCUITS FOR HIGH-SIDE LOAD SWITCHES

(71) Applicant: Navitas Semiconductor Limited, Dublin (IE)

(72) Inventors: Wei Qin, Hangzhou (CN); Zhenxu Zha, Hangzhou (CN); Huanxi Wang, Shenzhen (CN); Zhijun Hu, Shanghai (CN); Yueliang Luo, Shanghai (CN); Yunkai Sun, Hangzhou (CN)

(73) Assignee: NAVITAS SEMICONDUCTOR LIMITED, Dublin (IE)

( * ) Notice: Subject to any disclaimer, the term of this patent is extended or adjusted under 35 U.S.C. 154(b) by 196 days.

(21) Appl. No.: 18/596,367

(22) Filed: Mar. 5, 2024

(65) Prior Publication Data

US 2024/0313767 A1    Sep. 19, 2024

(30) Foreign Application Priority Data

Mar. 15, 2023   (CN) .......................... 202310269432.1

(51) Int. Cl.
| | |
|---|---|
| *H03K 17/60* | (2006.01) |
| *G05F 1/56* | (2006.01) |
| *H03K 17/687* | (2006.01) |

(52) U.S. Cl.
CPC .............. *H03K 17/60* (2013.01); *G05F 1/56* (2013.01); *H03K 17/687* (2013.01); *H03K 2217/0063* (2013.01); *H03K 2217/0072* (2013.01)

(58) Field of Classification Search
CPC .................................................... H03K 17/60
USPC ........................................................ 327/109
See application file for complete search history.

(56) References Cited

U.S. PATENT DOCUMENTS

| | | |
|---|---|---|
| 2006/0002154 A1 | 1/2006 | Amrani et al. |
| 2016/0268796 A1 | 9/2016 | Torres et al. |
| 2021/0258006 A1* | 8/2021 | Kim ..................... H03K 17/063 |

FOREIGN PATENT DOCUMENTS

| | | |
|---|---|---|
| CN | 101010650 A | 8/2007 |
| CN | 101165497 A | 4/2008 |
| CN | 105977904 A | 9/2016 |
| JP | 2004208185 A | 7/2004 |
| JP | 2016007120 A | 1/2016 |

OTHER PUBLICATIONS

Office Action in CN202311060082.4, mailed Feb. 9, 2024, 9 pages.

* cited by examiner

*Primary Examiner* — Tomi Skibinski
(74) *Attorney, Agent, or Firm* — FisherBroyles, LLP

(57) ABSTRACT

A circuit. The circuit includes a switch having a gate terminal, a source terminal and a drain terminal, a switch driver circuit connected to the gate terminal and arranged to control an on-state and an off-state of the switch, the switch drive circuit including: a signal conversion circuit arranged to receive a control signal and in response generate a high-side signal; a signal buffer circuit coupled to the signal conversion circuit and arranged to receive the high-side signal and in response generate a buffered signal; and a drive circuit coupled to the signal buffer circuit and arranged to receive the buffered signal and in response generate a gate drive signal that causes the switch to transition between the on-state and the off-state. In one aspect, the switch is an NMOS transistor having a gate, a source and a drain, where the source and drain are at substantially high voltage.

18 Claims, 12 Drawing Sheets

DRIVE CIRCUITS FOR HIGH-SIDE LOAD SWITCHES

CROSS REFERENCE TO RELATED APPLICATIONS

This application claims priority to Chinese provisional patent application no. 202310269432.1, for "HIGH-VOLT-AGE SIDE LOAD SWITCH TRANSISTOR DRIVE CIR-CUIT" filed on Mar. 15, 2023, which is hereby incorporated by reference in entirety for all purposes.

FIELD

The described embodiments relate generally to power converters, and more particularly, the present embodiments relate to drive circuits for high-side load switches used in power converters.

BACKGROUND

Electronic devices such as computers, servers and televisions, among others, employ one or more electrical power conversion circuits to convert one form of electrical energy to another. Some electrical power conversion circuits convert a high DC voltage to a lower DC voltage using a circuit topology called a half bridge converter. As many electronic devices are sensitive to size and efficiency of the power conversion circuit, new power converters can provide relatively higher efficiency and lower size for the new electronic devices.

SUMMARY

In some embodiments, a circuit is disclosed. The circuit includes a switch having a gate terminal, a source terminal and a drain terminal; a switch driver circuit connected to the gate terminal and arranged to control an on-state and an off-state of the switch, the switch drive circuit including: a signal conversion circuit arranged to receive a control signal and in response generate a high-side signal; a signal buffer circuit coupled to the signal conversion circuit and arranged to receive the high-side signal and in response generate a buffered signal; and a drive circuit coupled to the signal buffer circuit and arranged to receive the buffered signal and in response generate a gate drive signal that causes the switch to transition between the on-state and the off-state.

In some embodiments, the switch is a n-channel metal-oxide-semiconductor (NMOS) transistor.

In some embodiments, the drain terminal is coupled to a first terminal being at a substantially first high voltage and the source terminal is coupled to a second terminal being at a second substantially high voltage.

In some embodiments, the circuit further includes a power supply coupled to the signal buffer circuit and the drive circuit, and arranged to generate power for the signal buffer circuit and the drive circuit.

In some embodiments, the signal conversion circuit includes an NPN transistor having a first collector terminal, a first emitter terminal and a first base terminal.

In some embodiments, the signal conversion circuit further includes a first impedance element coupled between the first base terminal and the first emitter terminal, a second impedance element coupled between the first emitter terminal and a ground node and a third impedance element coupled in series with the first base terminal.

In some embodiments, the switch driver circuit is connected to the gate terminal through a fourth impedance element and the gate terminal is connected to the source terminal through a fifth impedance element.

In some embodiments, the signal buffer circuit includes a PNP transistor having a second collector terminal, a second emitter terminal and a second base terminal.

In some embodiments, the signal buffer circuit further includes a sixth impedance element coupled between the second emitter terminal and the second base terminal, and a diode coupled between the second collector terminal and the second base terminal.

In some embodiments, a circuit is disclosed. The circuit includes a boost circuit having an input terminal and an output terminal, and arranged to receive a line voltage at the input terminal and generate a substantially high voltage at its output terminal; a switch having a gate terminal, a source terminal and a drain terminal, the drain terminal being connected to the output terminal; a switch driver circuit connected to the gate terminal and arranged to control an on-state and an off-state of the switch, the switch drive circuit including: a signal conversion circuit arranged to receive a control signal and in response generate a high-side signal; a signal buffer circuit coupled to the signal conversion circuit and arranged to receive the high-side signal and in response generate a buffered signal; and a drive circuit coupled to the signal buffer circuit and arranged to receive the buffered signal and in response generate a gate drive signal that causes the switch to transition between the on-state and the off-state.

In some embodiments, a method of operating a circuit is disclosed. The method includes providing a n-channel metal-oxide-semiconductor (NMOS) transistor having a gate terminal, a source terminal and a drain terminal; receiving, by a signal conversion circuit, a control signal and in response generating a high-side signal; receiving, by a signal buffer circuit, the high-side signal and in response generating a buffered signal; and receiving, by a drive circuit, the buffered signal and in response generating a gate drive signal causing the NMOS transistor to transition between an on-state and an off-state.

DETAILED DESCRIPTION OF THE INVENTION

Circuits, structures, and related techniques disclosed herein relate generally to power converters. More specifically, circuits, devices and related techniques disclosed herein relate to drive circuits used to control high-side load switches used in power converters. In some embodiments, the drive circuits can be used to control high-side high voltage NMOS switches used in power converters. In various embodiments, the drive circuit can enable increased efficiency of the power converter, increased operational speed, improved system reliability by reducing sensitivity to circuit parasitics, while reducing system standby power losses.

In some embodiments, a drive circuit used for high-side high voltage NMOS switches can include a signal conversion circuit arranged to receive a low-side signal and generate a high-side signal that corresponds to the low-side signal, a signal buffer circuit coupled to the signal conversion circuit and arranged to receive the high-side signal and generate a buffered signal that corresponds to high-side signal, and a drive buffer circuit coupled to the signal buffer circuit and arranged to generate an output signal that corresponds to the buffered signal 110. The drive buffer circuit can be coupled to an NMOS switch having gate terminal, a source terminal and a drain terminal, where the buffer signal may be arranged to control a conductivity state of the NMOS switch corresponding to the low-side signal. Various inventive embodiments are described herein, including methods, processes, systems, devices, and the like.

Several illustrative embodiments will now be described with respect to the accompanying drawings, which form a part hereof. The ensuing description provides embodiment (s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

Figure 1:
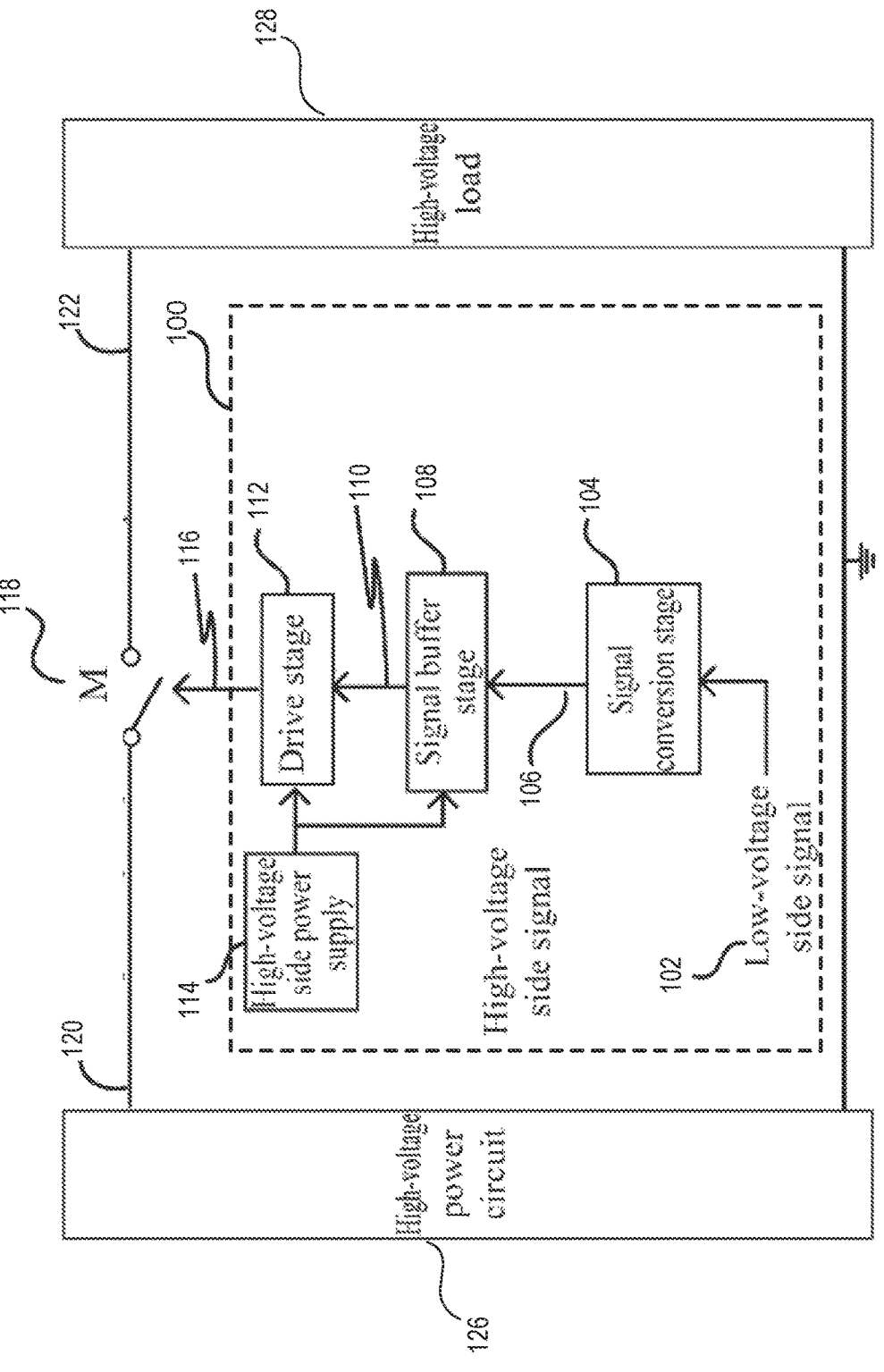
FIG. 1 illustrates a schematic of a drive circuit for a high-side load switch according to some embodiments of the disclosure.

FIG. 1 illustrates a schematic of a drive circuit for a high-side load switch according to some embodiments of the disclosure. In various embodiments, the illustrated drive circuit can be used to drive a high-side high voltage load switch. A drive circuit for the high-side load switch 100 can be arranged to drive a switch 118, where the switch 118 may be coupled between a high voltage power circuit 126 and a high voltage load 128. The switch 118 may be coupled between a high-voltage output terminal 120 of the high-voltage power circuit 126 and an input terminal 122 of the high-voltage load 128. The drive circuit for the high-side load switch 100 can include a signal conversion circuit 104 having an input terminal 140 and arranged to receive a low-side signal 102. The signal conversion circuit 104 can be arranged to generate a high-side signal 106 that corresponds to the low-side signal 102. In some embodiments, the switch 118 may be a transistor. In various embodiments, the transistor may be an N-channel MOSFET (NMOS). In some embodiments, the high-voltage output terminal 120 can be at a first substantially high voltage and the input terminal 122 can be a at a second substantially high voltage. In various embodiments, a high voltage signal may have a range from 100 V to 1200 V, while in other embodiments it may have a range from 200 V to 800 V, while yet in other embodiments it may have a range from 500 V to 600 V. As appreciated by one of ordinary skill in the art having the benefit of this disclosure, the voltage values of the signals can be set to any suitable value.

The drive circuit for the high-side load switch 100 can further include a signal buffer circuit 108 that is coupled to the signal conversion circuit 104. The signal buffer circuit 108 can be arranged to receive the high-side signal 106. The signal buffer circuit 108 can be arranged to generate a buffered signal 110 that corresponds to high-side signal 106. The drive circuit for the high-side load switch 100 can further include a drive buffer circuit 112 that is coupled to the signal buffer circuit 108. The drive buffer circuit 112 can be arranged to generate a signal 116 that corresponds to the buffered signal 110. The signal 116 can be used to drive the switch 118. In some embodiments, the drive circuit for the high-side load switch 100 can include a high voltage power supply 114 that is coupled to the signal buffer circuit 108 and to the drive buffer circuit 112. The high voltage supply 114 can be arranged to supply power to the signal buffer circuit 108 and to the drive buffer circuit 112. In some embodiments, the drive circuit for high-side load switch 100 may be an integrated circuit formed on a silicon-based or gallium nitride (GaN) based wafer.

Figure 2:
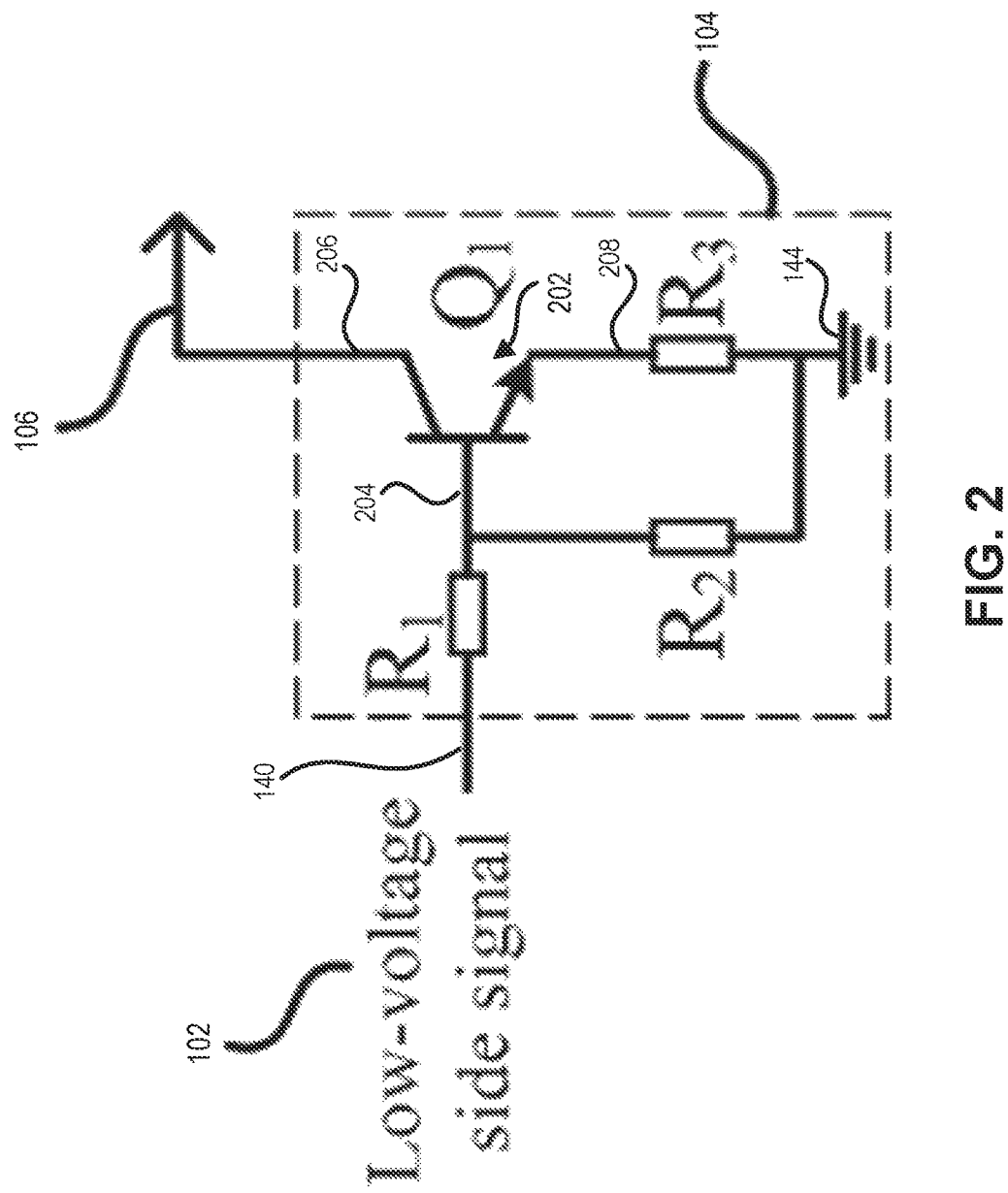
FIG. 2 illustrates a schematic of the signal conversion circuit, according to some embodiments.

FIG. 2 illustrates a schematic of the signal conversion circuit 104, according to some embodiments. The signal conversion circuit 104 can include a transistor 202. In some embodiments, the transistor 202 may be an NPN bipolar transistor. In various embodiments, the transistor 202 may be a high voltage NPN bipolar transistor. In some embodiments, the transistor 202 may be a NMOS. The transistor 202 may have a base terminal 204, a collector terminal 206 and an emitter terminal 208. The base terminal 204 may be coupled to the input terminal 140 through an impedance element R1. The base terminal may further be coupled a ground node 144 through an impedance element R2. The emitter terminal 208 may be coupled to a ground node 144 through an impedance element R3. In some embodiments, impedance elements R1, R2 and R3 can be resistors.

The signal conversion circuit 104 may receive a low-side signal 102 and convert it to the high-side signal 106 at the collector terminal 206. In some embodiments, the high-side signal 106 can be a high voltage high-side signal. In some embodiments, a high voltage signal may have a range from 20 V to 1200 V, while in other embodiments it may have a range from 100 V to 800 V, while yet in other embodiments it may have a range 500 V to 600 V. As appreciated by one of ordinary skill in the art having the benefit of this disclosure, the voltage values of the signals can be set to any suitable value.

Figure 3C:
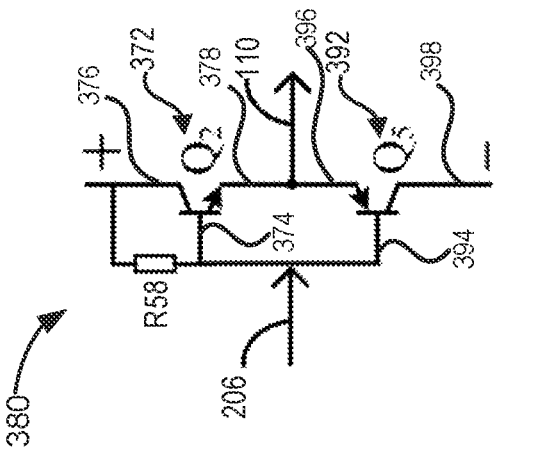
FIG. 3C illustrates a circuit schematic of a yet alternate signal buffer circuit, according to some embodiments.
Figure 3B:
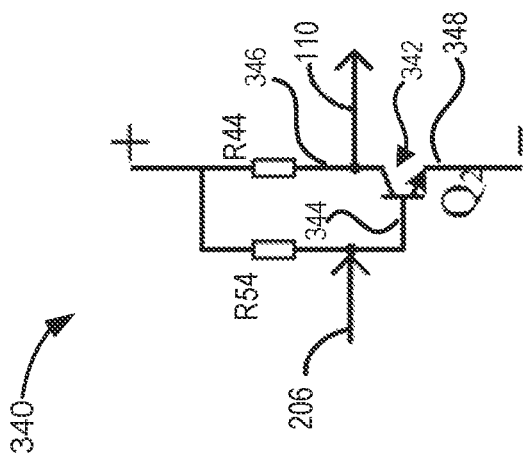
FIG. 3B illustrates a circuit schematic of an alternate signal buffer circuit, according to some embodiments.
Figure 3A:
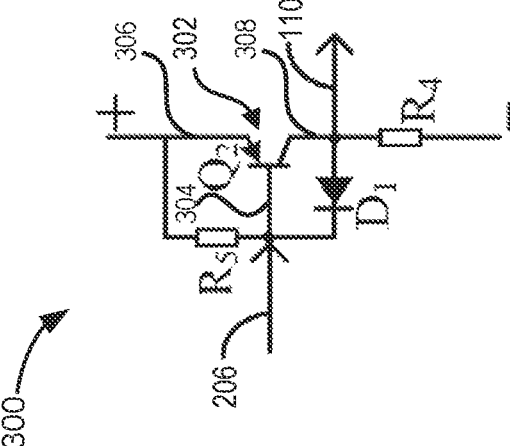
FIG. 3A illustrates a circuit schematic of a signal buffer circuit, according to certain embodiments.

FIGS. 3A-3C illustrate various embodiments of schematics of the signal buffer circuit 108. FIG. 3A illustrates a circuit schematic 300 of the signal buffer circuit 108, according to certain embodiments. The circuit schematic 300 can include a transistor 302. In some embodiments, the transistor 302 may be a PNP bipolar transistor. In various embodiments, the transistor 302 may be a high voltage PNP bipolar transistor. In some embodiments, the transistor 302 may be a P-channel MOSFET (PMOS). The transistor 302 may have a base terminal 304, a collector terminal 308 and an emitter terminal 306. The base terminal 304 may be coupled to the collector terminal 206 of the signal conversion circuit 104. The base terminal 304 may further be coupled the emitter terminal 306 through an impedance element R5. The collector terminal 308 may be coupled to the base terminal 304 through a diode D1. The collector terminal may further be coupled to a negative end of a high-voltage side power supply through an impedance element R4. The emitter terminal 306 can be coupled to a positive end of the high-voltage side power supply. The collector terminal 308 can be arranged to generate a buffered signal 110. The signal buffer circuit shown in FIG. 3A can be arranged to receive the high-side signal 106 and generate a corresponding buffered signal 110, thereby acting as a high-side buffer circuit. In some embodiments, impedance elements R4 and R5 can be resistors.

FIG. 3B illustrates a circuit schematic 340 of the signal buffer circuit 108, according to some embodiments. The circuit schematic 340 can include a transistor 342. In some embodiments, the transistor 302 may be an NPN bipolar transistor. In various embodiments, the transistor 342 may be a high voltage NPN bipolar transistor. In some embodiments, the transistor 342 may be a NMOS. The transistor 342 may have a base terminal 344, a collector terminal 346 and an emitter terminal 348. The base terminal 344 may be coupled to the collector terminal 206 of the signal conversion circuit 104. The base terminal 344 may further be coupled the positive end of the high-voltage side power supply through an impedance element R54. The collector terminal 346 can be coupled the positive end of the high-voltage side power supply through an impedance element R44. The emitter terminal 348 may be coupled to a negative end of a high-voltage side power supply. The collector terminal 308 can be arranged to generate a buffered signal 110. The signal buffer circuit shown in FIG. 3B can be arranged to receive the high-side signal 106 and generate a corresponding buffered signal 110, thereby acting as a high-side buffer circuit. In some embodiments, impedance elements R44 and R54 can be resistors.

FIG. 3C illustrates a circuit schematic 380 of the signal buffer circuit 108, according to some embodiments. The circuit schematic 380 can include a transistor 372. In some embodiments, the transistor 372 may be an NPN bipolar transistor. In various embodiments, the transistor 372 may be a high voltage NPN bipolar transistor. In some embodiments, the transistor 372 may be a NMOS. The transistor 372 may have a base terminal 374, a collector terminal 376 and an emitter terminal 378. The base terminal 374 may be coupled to the collector terminal 206 of the signal conversion circuit 104. The base terminal 374 may further be coupled the positive end of the high-voltage side power supply through an impedance element R58. The collector terminal 346 can be coupled the positive end of the high-voltage side power supply. The circuit schematic 380 can further include a transistor 392. In some embodiments, the transistor 392 may be a PNP bipolar transistor. In various embodiments, the transistor 392 may be a high voltage PNP bipolar transistor. In some embodiments, the transistor 392 may be a PMOS. The transistor 392 may have a base terminal 394, a collector terminal 398 and an emitter terminal 396. The base terminal 394 may be coupled to the collector terminal 206 of the signal conversion circuit 104. The base terminal 394 may further be coupled the base terminal 374. The collector terminal 398 can be coupled the negative end of the high-voltage side power supply. The emitter terminal 398 may be coupled to the emitter terminal 378 and be arranged to generate a buffered signal 110. The signal buffer circuit shown in FIG. 3C can be arranged to receive the high-side signal 106 and generate a corresponding buffered signal 110, thereby acting as a high-side buffer circuit. In some embodiments, impedance elements R58 can be a resistor.

Figure 4:
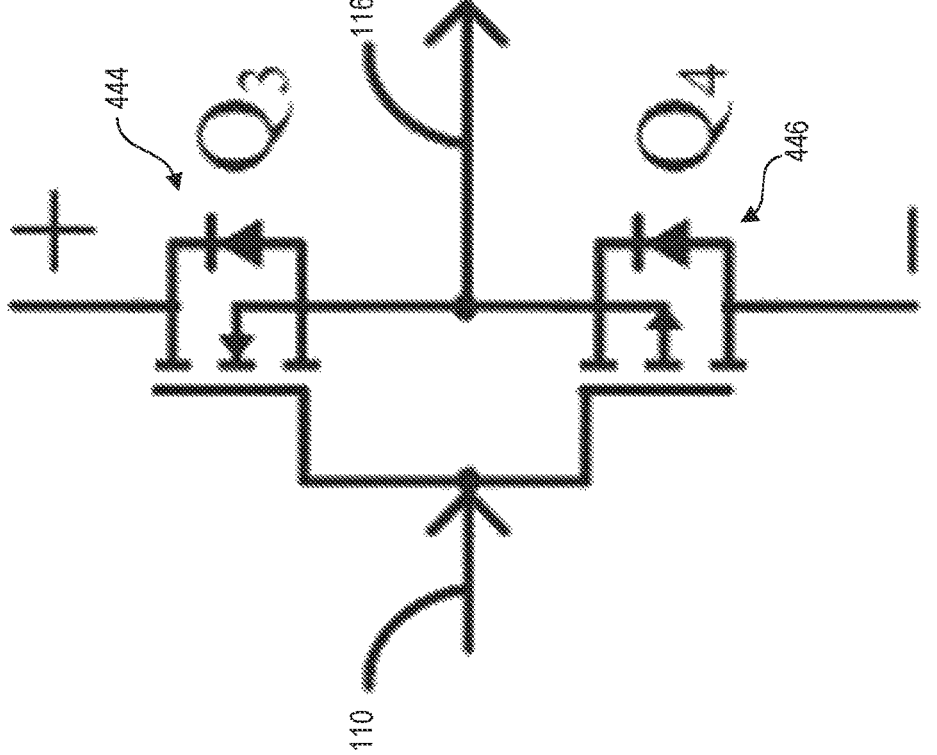
FIG. 4 illustrates a schematic of the drive buffer circuit, according to some embodiments.
Figure 4:
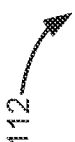

FIG. 4 illustrates a schematic of the drive buffer circuit 112, according to some embodiments. The drive buffer circuit 112 can include transistors 444 and 446. In some embodiments, transistor 444 may be an NMOS and transistor 446 may be a PMOS. In various embodiments, transistors 444 may be an NPN and transistor 446 may be a PNP transistor. Transistors 444 and 446 can be coupled to form a push-pull drive circuit. The drive buffer circuit 112 can be arranged to convert the buffered signal 110 into a drive signal 116 having relatively strong drive capability.

In some embodiments, the high-side power supply 114 can be an isolated auxiliary power source. In various embodiments, high-side power supply 114 can be an auxiliary winding with a diode rectification structure of a boost circuit inductor, or an auxiliary winding and a diode rectification structure of a buck circuit inductor, or a transformer auxiliary winding and a rectification structure in an isolation topology.

Figure 5:
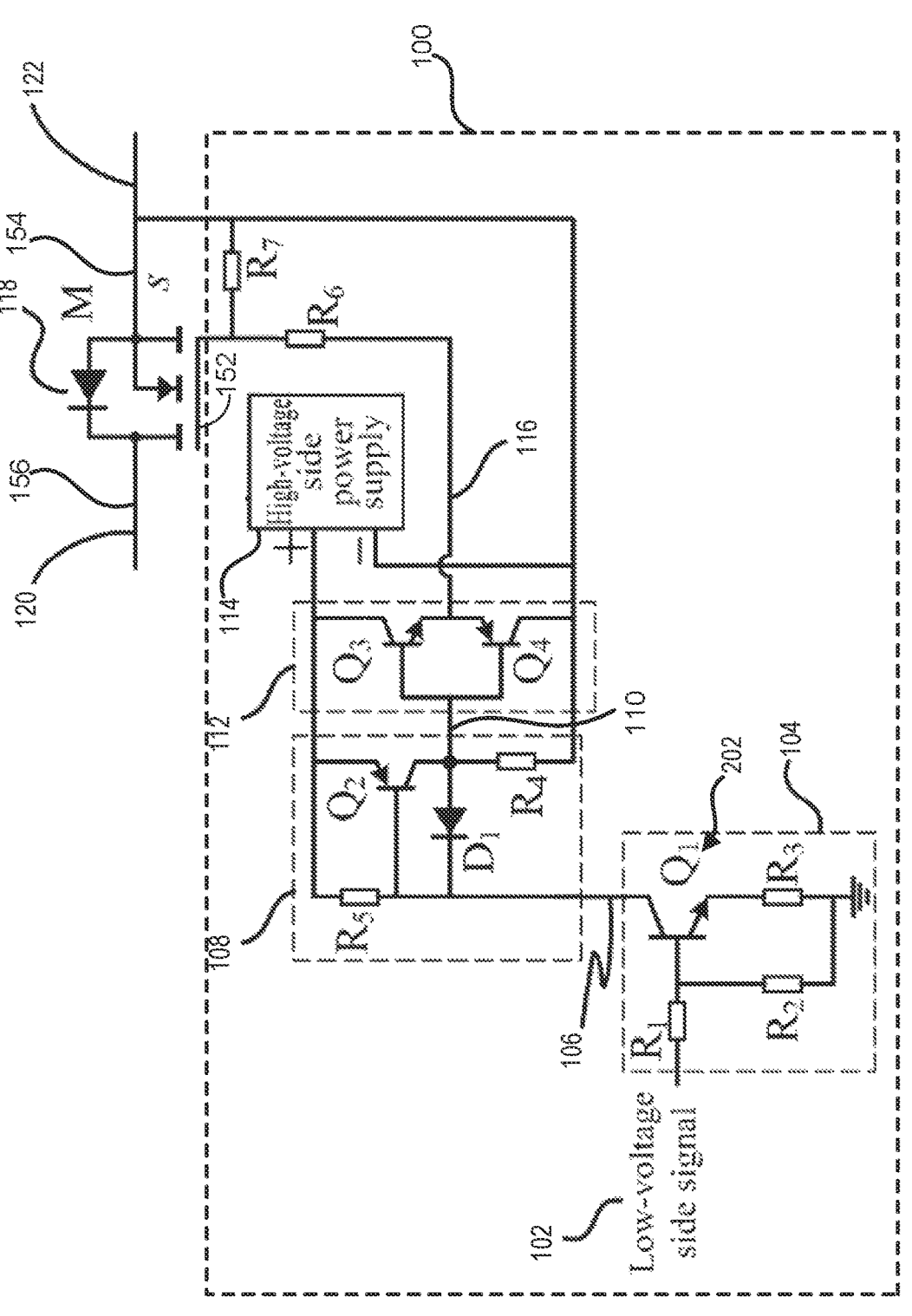
FIG. 5 illustrates a detailed schematic of a drive circuit for a high-side load switch, according to some embodiments of the disclosure.

FIG. 5 illustrates a detailed schematic of a drive circuit for a high-side load switch, according to some embodiments of the disclosure. The drive circuit for the high-side load switch 100 can include the signal conversion circuit 104 coupled to the signal buffer circuit 108, that is coupled to the drive buffer circuit 112. The high voltage power supply 114 can be coupled to the signal buffer circuit 108 and the drive buffer circuit 112. The high voltage power supply 114 can be arranged to supply power to the signal buffer circuit 108 and the drive buffer circuit 112. The signal conversion circuit 104 is described in detail in the above sections. The signal conversion circuit 104 may receive a low-side signal 102 and convert it to the high-side signal 106. In some embodiments, the high-side signal 106 can be a high voltage high-side signal. In some embodiments, a high voltage signal may have a range from 100 V to 1200 V, while in other embodiments it may have a range from 200 V to 800 V, while yet in other embodiments it may have a range from 500 V to 600 V. As appreciated by one of ordinary skill in the art having the benefit of this disclosure, the voltage values of the signals can be set to any suitable value.

The signal buffer circuit 108 is described in detail in FIG. 3A section above. The signal buffer circuit 108 can be arranged to receive the high-side signal 106 and generate a corresponding buffered signal 110, thereby acting as a high-side buffer circuit. The drive buffer circuit 112 is described in detail in FIG. 4 section above. The drive buffer circuit 112 can be arranged to convert the buffered signal 110 into a drive signal 116 having relatively strong drive capability.

The switch 118 can have a gate terminal 152, a source terminal 154 and a drain terminal 156. The drive signal 116 can be applied to the gate terminal 152 to control conductivity state of the switch 118. In some embodiments, the drive signal 116 can be applied to the gate terminal 152 through an impedance element R6. In various embodiments, the drive signal 116 can be applied directly to the gate terminal 152. The drive circuit for the high-side load switch 100 can include an impedance element R7 that can be coupled between the gate terminal 152 and the source terminal 154. By using the impedance elements R6 and R7, the drive circuit for the high-side load switch 100 can operated with improved efficiency.

Figure 6:
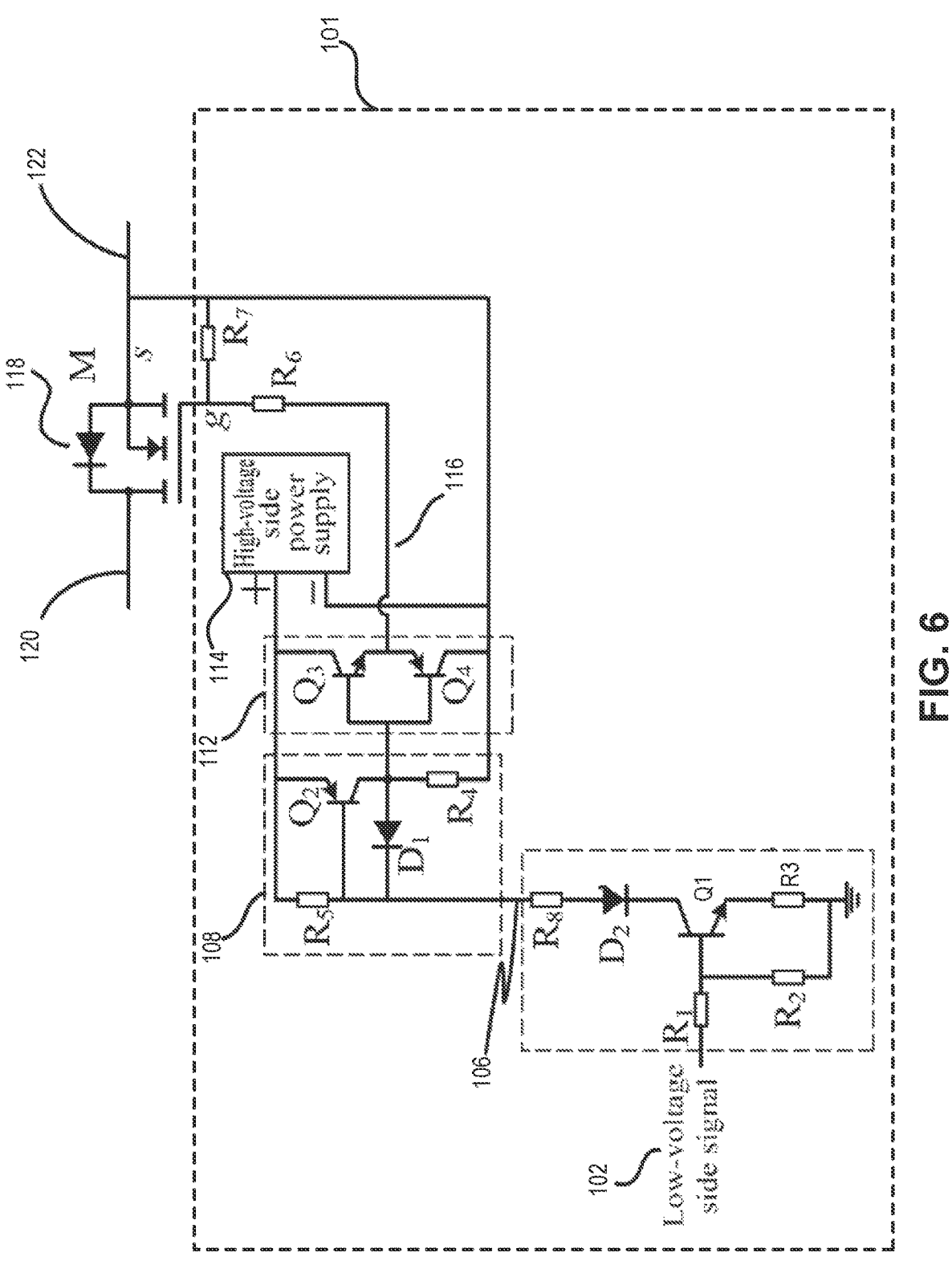
FIG. 6 illustrates a schematic of a drive circuit for a high-side load switch, according to certain embodiments of the disclosure.

FIG. 6 illustrates a schematic of a drive circuit for a high-side load switch, according to certain embodiments of the disclosure. A drive circuit for the high-side load switch 101 is similar to the drive circuit for the high-side load switch 100, except that a diode D2 is coupled to the transistor Q1. Further, an impedance element R8 is coupled to the diode D2. In some embodiments, impedance elements R, R7 and R8 can be resistors.

Figure 7:
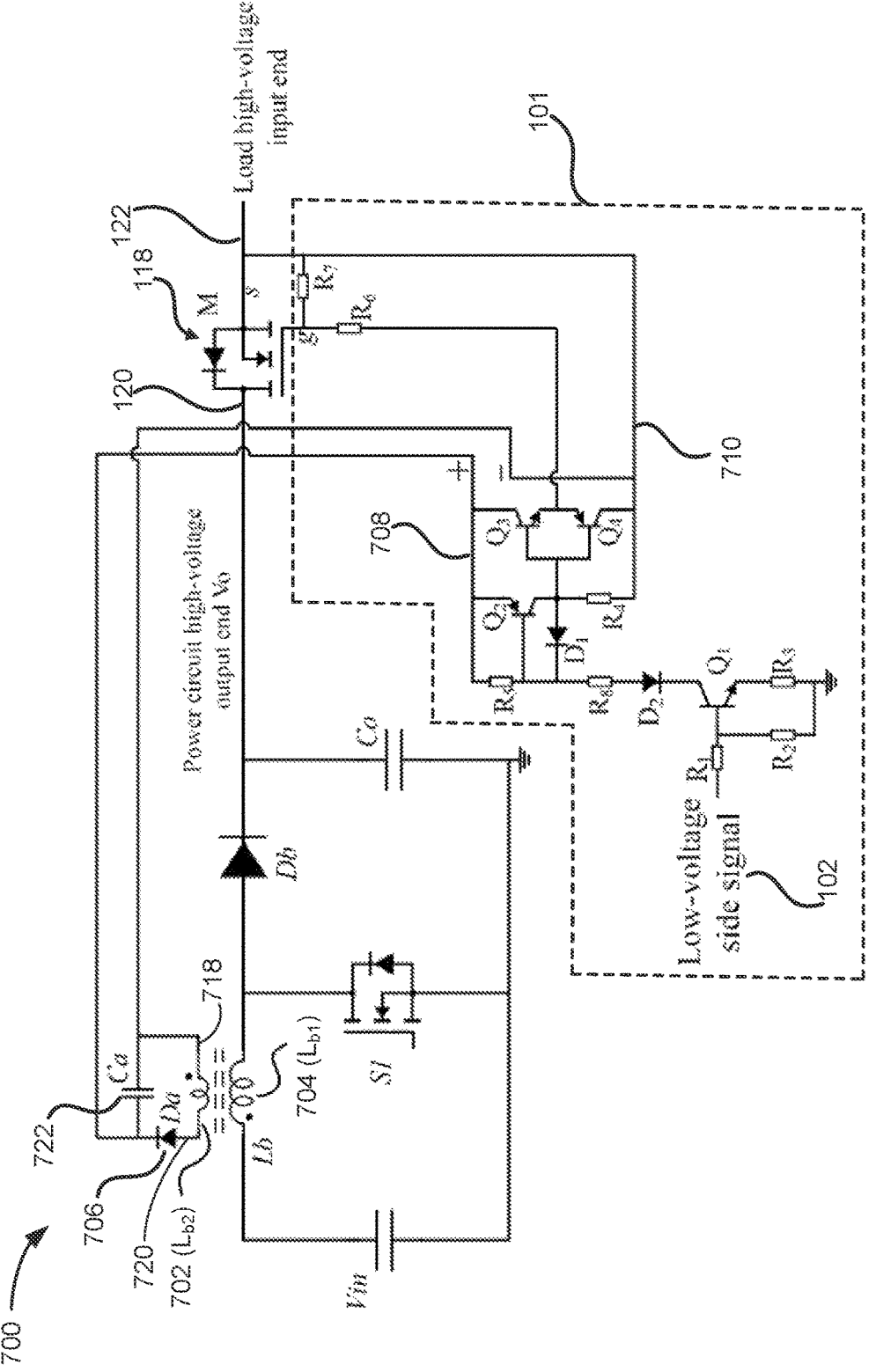
FIG. 7 illustrates a boost system using a drive circuit for a high-side load switch, according to some embodiments of the disclosure.

FIG. 7 illustrates a boost system using a drive circuit for a high-side load switch, according to some embodiments of the disclosure. A boost system 700 can utilize the drive circuit for a high-side load switch 101 to drive a switch 118. The switch 118 can coupled between a high voltage output terminal 120 of the boost system 700 and a high-voltage input terminal 122 of a load. The drive circuit for a high-side load switch 101 can enable control of a conductivity state of the switch 118 in response to receiving a low-side signal 102. The boost system 700 may include a boost inductor 704 having a value of Lb1. The boost system 700 may further include an auxiliary inductor 702 having a value of Lb2. The auxiliary inductor 702 can have a first terminal 718 and a second terminal 720, and can be coupled to a positive auxiliary supply terminal 708 through an auxiliary diode 706. The auxiliary diode can be coupled to an auxiliary capacitor 722. The auxiliary inductor 702 may also be coupled to a negative auxiliary supply terminal 710. The auxiliary inductor 702, the auxiliary diode 706 and the auxiliary capacitor 722 can for a high-side power supply 114.

Figure 8:
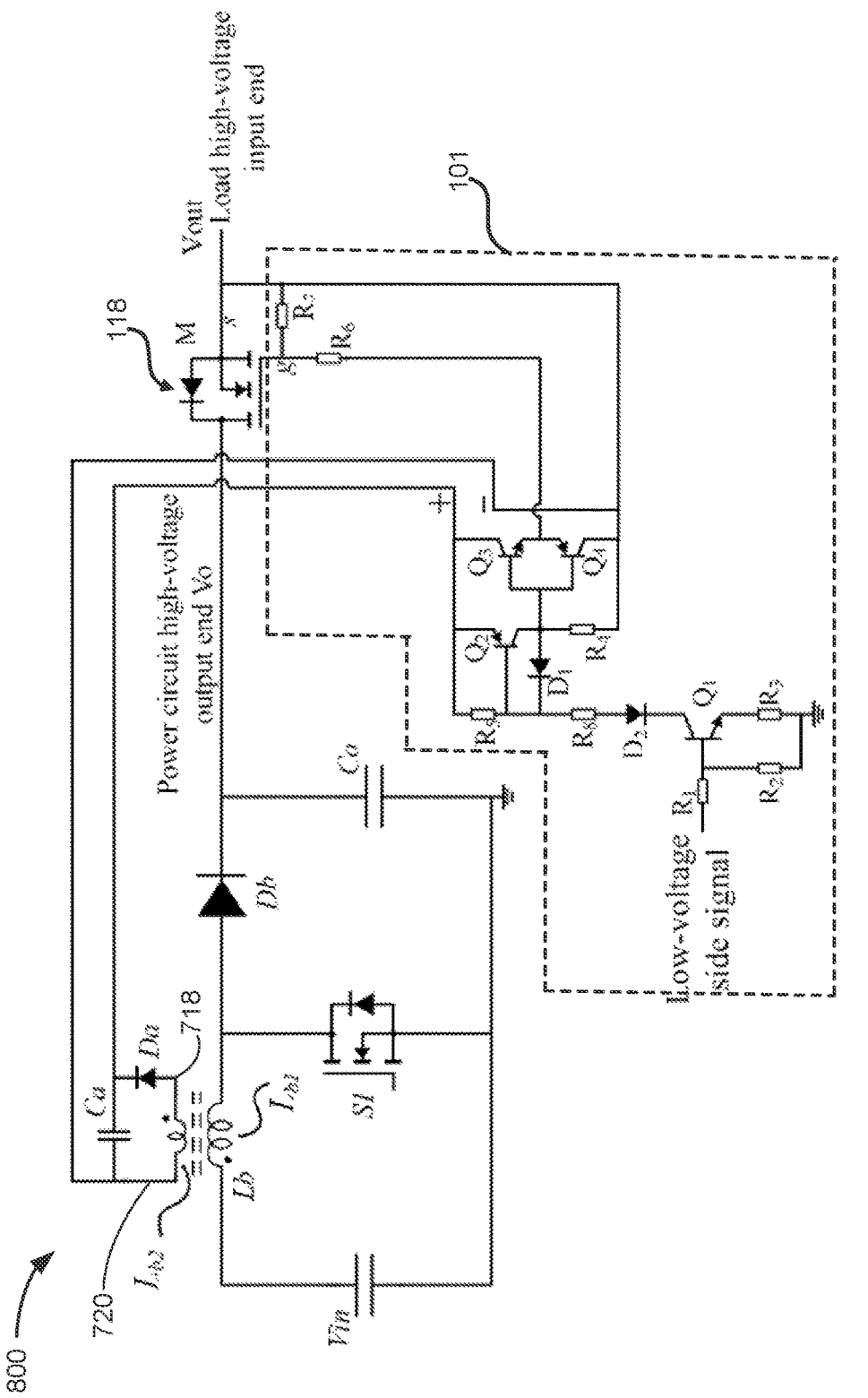
FIG. 8 illustrates a boost system using a drive circuit for a high-side load switch, according to certain embodiments of the disclosure.

FIG. 8 illustrates a boost system using a drive circuit for a high-side load switch, according to certain embodiments of the disclosure. A boost system 800 can utilize the drive circuit for a high-side load switch 101 to drive a switch 118. The boost system 800 is similar to the boost system 700, except the auxiliary capacitor 722 can be connected between a cathode of the auxiliary diode 706 and a second terminal 720 end of the auxiliary inductor 706 to form the high-voltage side power supply 114.

Figure 9:
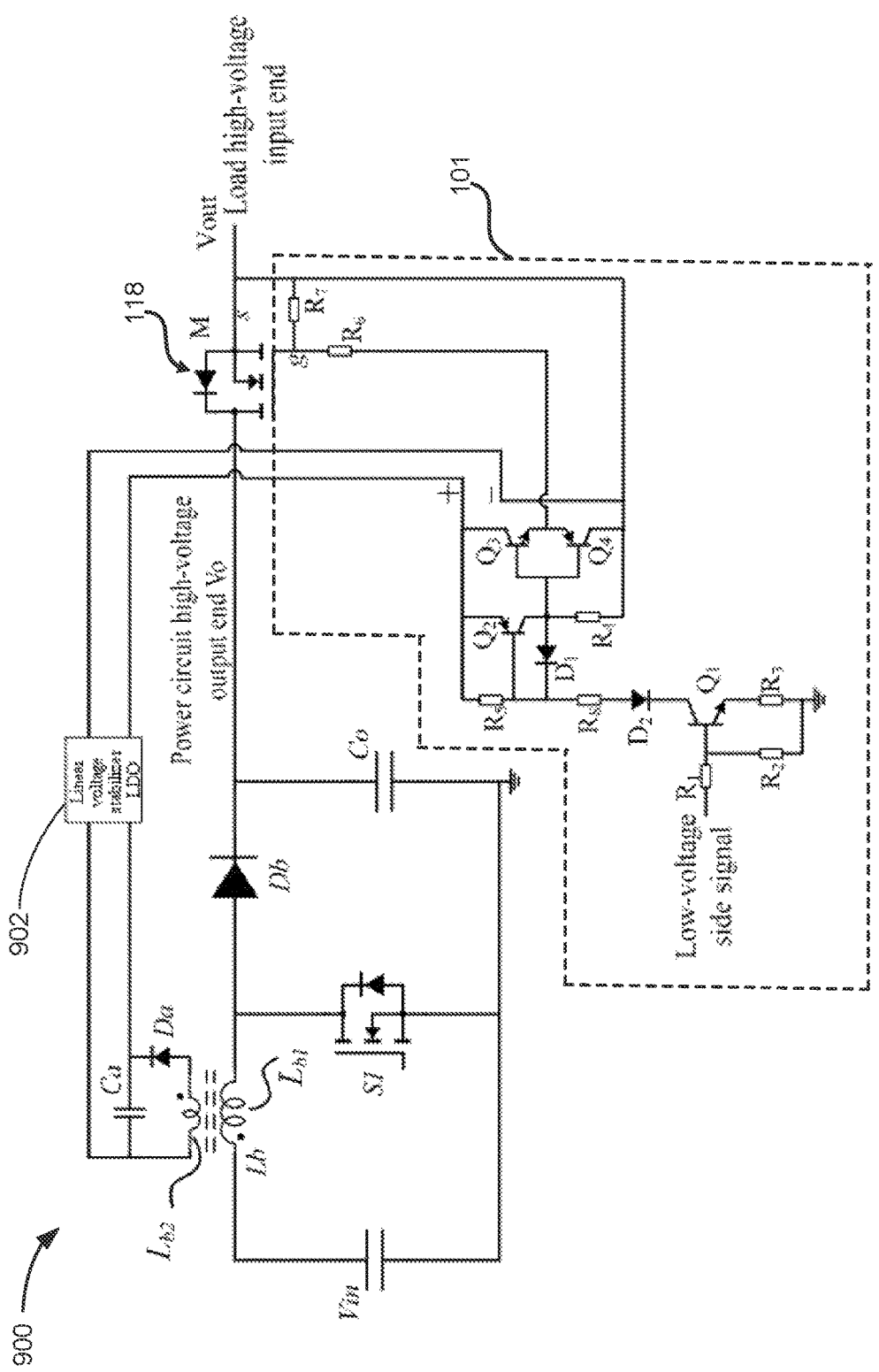
FIG. 9 illustrates a boost system having an LDO using a drive circuit for a high-side load switch, according to certain embodiments of the disclosure.

FIG. 9 illustrates a boost system having an LDO using a drive circuit for a high-side load switch, according to certain embodiments of the disclosure. A boost system 900 can utilize the drive circuit for a high-side load switch 101 to drive a switch 118. The boost system 900 is similar to the boost system 800, except a low drop-out (LDO) 902 circuit has been added to the high-voltage side power supply 114. The LDO 902 can be coupled between the auxiliary capacitor 722 and a high-voltage side load drive circuit. The LDO 902 may be connected to a positive end and a negative terminal of the auxiliary capacitor 722.

Figure 10:
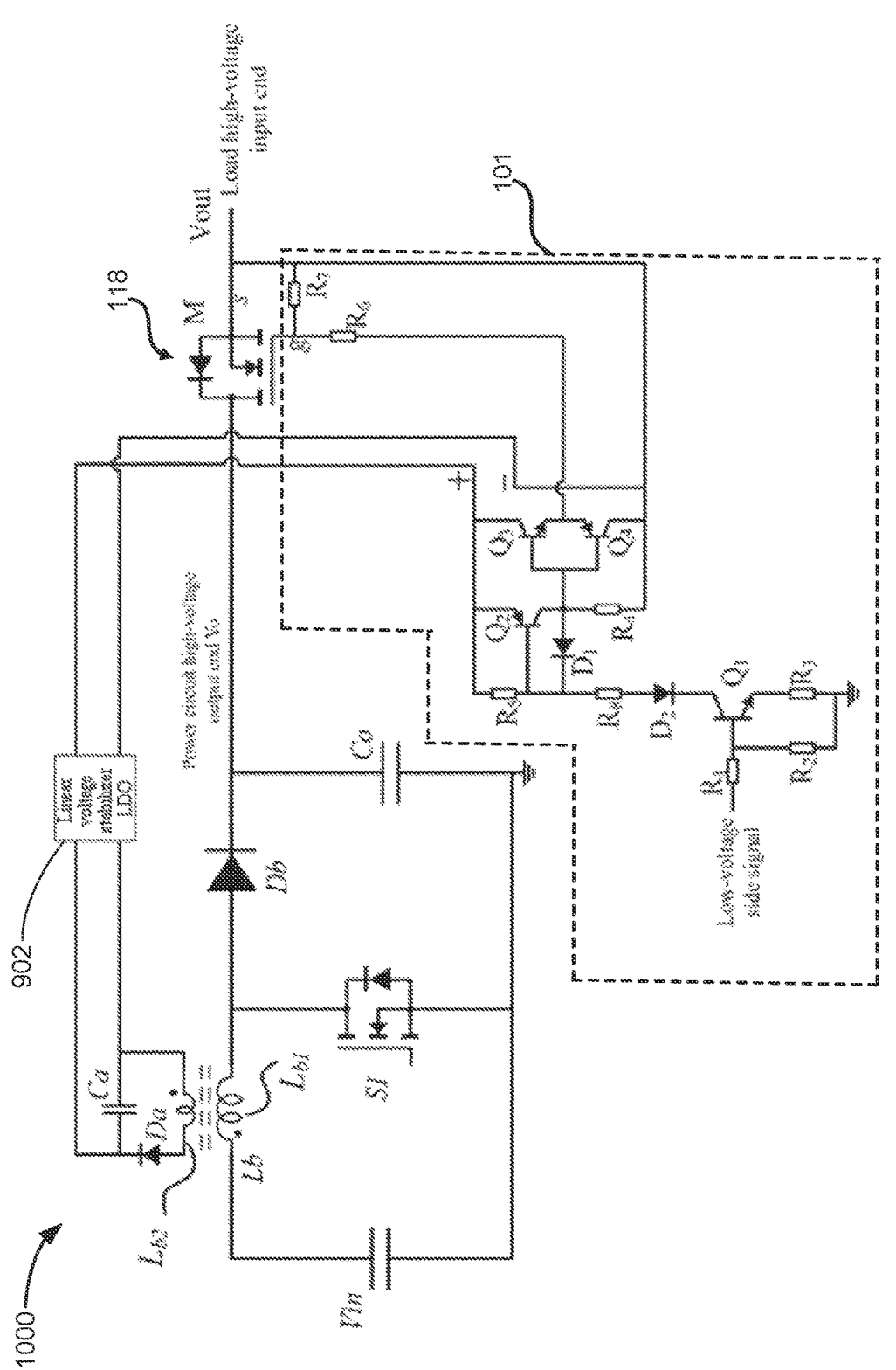
FIG. 10 illustrates a boost system having an LDO using a drive circuit for a high-side load switch, according to certain embodiments of the disclosure.

FIG. 10 illustrates a boost system having an LDO using a drive circuit for a high-side load switch, according to certain embodiments of the disclosure. A boost system 1000 can utilize the drive circuit for a high-side load switch 101 to drive a switch 118. The boost system 1000 is similar to the boost system 700, except a low drop-out (LDO) circuit has been added to the high-voltage side power supply 114. The LDO can be coupled between the auxiliary capacitor 722 and a high-voltage side load drive circuit. The LDO may be connected to a positive end and a negative terminal of the auxiliary capacitor 722.

Figure 11:
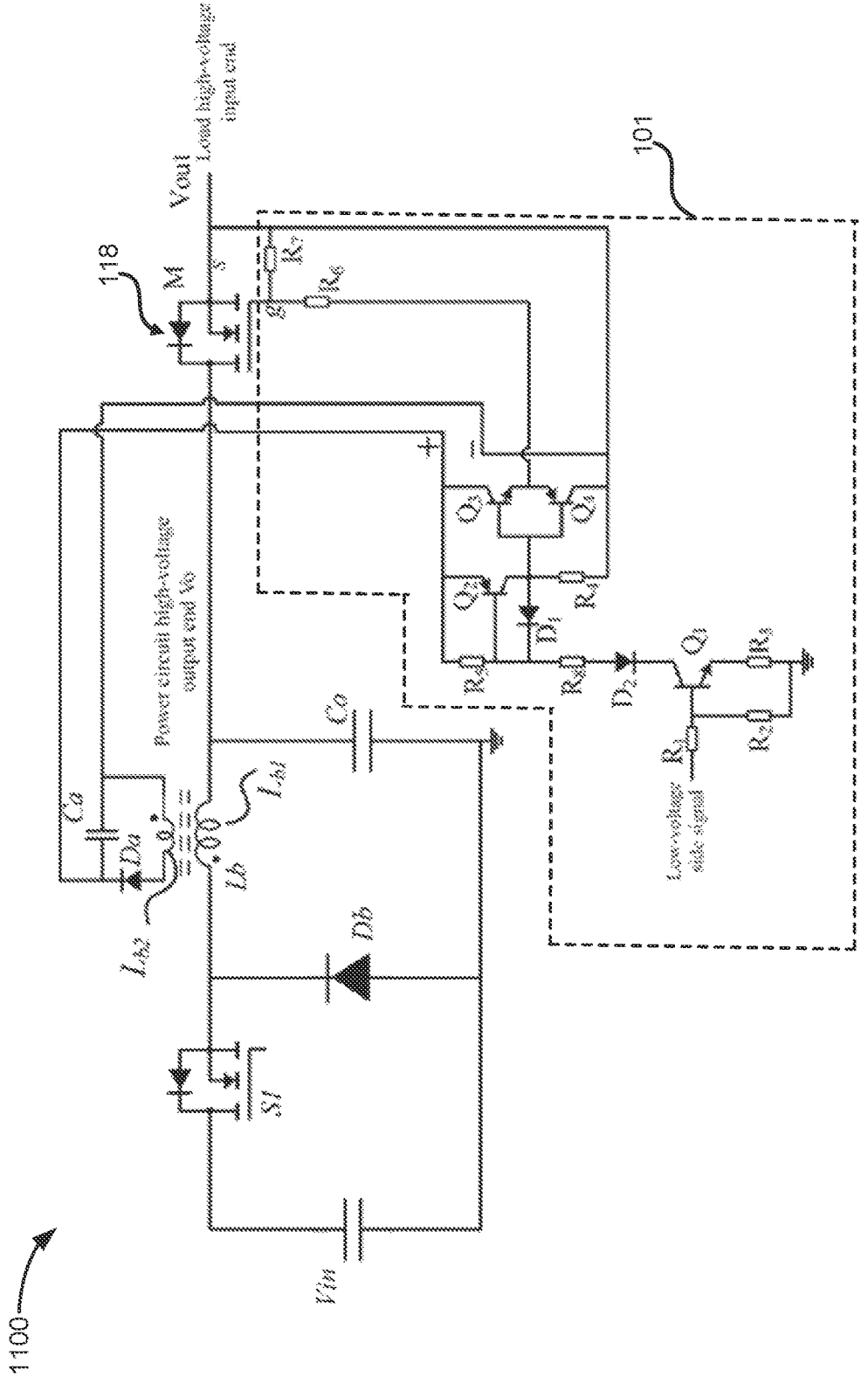
FIG. 11 illustrates a buck system using a drive circuit for a high-side load switch, according to certain embodiments of the disclosure.
Figure 12:
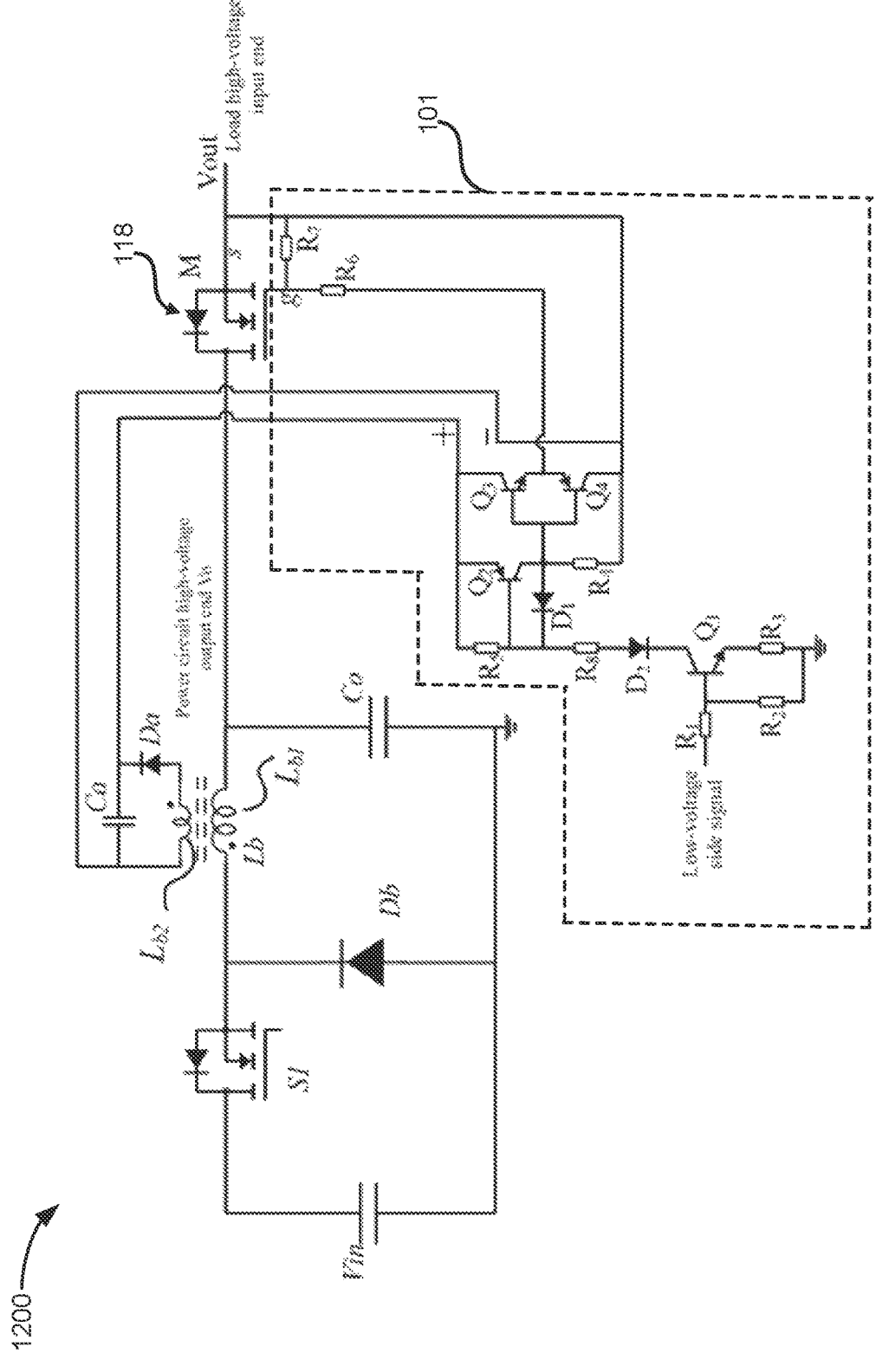
FIG. 12 illustrates a buck system using a drive circuit for a high-side load switch, according to some embodiments of the disclosure.

FIG. 11 illustrates a buck system using a drive circuit for a high-side load switch, according to certain embodiments of the disclosure. A buck system 1100 can utilize the drive circuit for a high-side load switch 101 to drive a switch 118. FIG. 12 illustrates a buck system using a drive circuit for a high-side load switch, according to some embodiments of the disclosure. A buck system 1100 can utilize the drive circuit for a high-side load switch 101 to drive a switch 118.

Although structures and techniques disclosed are described and illustrated herein with respect to some particular configurations of a drive circuit for a high-side load switch, embodiments of the disclosure are suitable for use with other configurations of power converters. For example, drive circuit for a high-side load switch can be utilized in power converter topologies such as, but not limited to, flyback, ACF, AHB, and LLC converters.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom or "top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

Terms "and," "or," and "an/or," as used herein, may include a variety of meanings that also is expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, B, C, AB, AC, BC, AA, AAB, ABC, AABBCCC, etc.

Reference throughout this specification to "one example," "an example," "certain examples," or "exemplary implementation" means that a particular feature, structure, or characteristic described in connection with the feature and/or example may be included in at least one feature and/or example of claimed subject matter. Thus, the appearances of the phrase "in one example," "an example," "in certain examples," "in certain implementations," or other like phrases in various places throughout this specification are not necessarily all referring to the same feature, example, and/or limitation. Furthermore, the particular features, structures, or characteristics may be combined in one or more examples and/or features.

In the preceding detailed description, numerous specific details have been set forth to provide a thorough understanding of claimed subject matter. However, it will be understood by those skilled in the art that claimed subject matter may be practiced without these specific details. In other instances, methods and apparatuses that would be known by one of ordinary skill have not been described in detail so as not to obscure claimed subject matter. Therefore, it is intended that claimed subject matter not be limited to the particular examples disclosed, but that such claimed subject matter may also include all aspects falling within the scope of appended claims, and equivalents thereof.

One of ordinary skill in the art will appreciate that other modifications to the apparatuses and methods of the present disclosure may be made for implementing various applications of the methods and systems for enhanced area getter architecture for a wafer-level vacuum packaged uncooled focal plane array without departing from the scope of the present disclosure.

The examples and embodiments described herein are for illustrative purposes only. Various modifications or changes in light thereof will be apparent to persons skilled in the art. These are to be included within the spirit and purview of this application, and the scope of the appended claims which follow.

What is claimed is:

1. A circuit comprising:
   a switch having a gate terminal, a source terminal and a drain terminal;
   a switch driver circuit connected to the gate terminal and arranged to control an on-state and an off-state of the switch, the switch drive circuit including:
      a signal conversion circuit arranged to receive a control signal and in response generate a high-side signal;
      a signal buffer circuit coupled to the signal conversion circuit and arranged to receive the high-side signal and in response generate a buffered signal; and
      a drive circuit coupled to the signal buffer circuit and arranged to receive the buffered signal and in response generate a gate drive signal that causes the switch to transition between the on-state and the off-state; and
   wherein the switch is a n-channel metal-oxide-semiconductor (NMOS) transistor.

2. The circuit of claim 1, wherein the drain terminal is coupled to a first terminal being at a substantially first high voltage and the source terminal is coupled to a second terminal being at a second substantially high voltage.

3. The circuit of claim 1, further comprising a power supply coupled to the signal buffer circuit and the drive circuit, and arranged to generate power for the signal buffer circuit and the drive circuit.

4. The circuit of claim 3, wherein the switch driver circuit is connected to the gate terminal through a fourth impedance element and wherein the gate terminal is connected to the source terminal through a fifth impedance element.

5. The circuit of claim 1, wherein the signal conversion circuit comprises an NPN transistor having a first collector terminal, a first emitter terminal and a first base terminal.

6. The circuit of claim 5, wherein the signal conversion circuit further comprises a first impedance element coupled between the first base terminal and the first emitter terminal, a second impedance element coupled between the first emitter terminal and a ground node and a third impedance element coupled in series with the first base terminal.

7. The circuit of claim 6, wherein the signal buffer circuit comprises a PNP transistor having a second collector terminal, a second emitter terminal and a second base terminal.

8. The circuit of claim 7, wherein the signal buffer circuit further comprises a sixth impedance element coupled between the second emitter terminal and the second base terminal, and a diode coupled between the second collector terminal and the second base terminal.

9. A circuit comprising:
   a boost circuit having an input terminal and an output terminal, and arranged to receive a line voltage at the input terminal and generate a substantially high voltage at its output terminal;
   a switch having a gate terminal, a source terminal and a drain terminal, the drain terminal being connected to the output terminal;
   a switch driver circuit connected to the gate terminal and arranged to control an on-state and an off-state of the switch, the switch drive circuit including:
      a signal conversion circuit arranged to receive a control signal and in response generate a high-side signal;
      a signal buffer circuit coupled to the signal conversion circuit and arranged to receive the high-side signal and in response generate a buffered signal; and
      a drive circuit coupled to the signal buffer circuit and arranged to receive the buffered signal and in response generate a gate drive signal that causes the switch to transition between the on-state and the off-state; and
   wherein the drain terminal is coupled to a first terminal being at a first substantially high voltage and the source terminal is coupled to a second terminal being at a second substantially high voltage.

10. The circuit of claim 9, wherein the switch is a n-channel metal-oxide- semiconductor (NMOS) transistor.

11. The circuit of claim 9, wherein further comprising a power supply coupled to the signal buffer circuit and the drive circuit, and arranged to generate power for the signal buffer circuit and the drive circuit.

12. The circuit of claim 9, wherein the signal conversion circuit comprises an NPN transistor having a first collector terminal, a first emitter terminal and a first base terminal.

13. The circuit of claim 12, wherein the signal conversion circuit further comprises a first impedance element coupled between the first base terminal and the first emitter terminal, a second impedance element coupled between the first emitter terminal and a ground node and a third impedance element coupled in series with the first base terminal.

14. The circuit of claim 12, wherein the switch driver circuit is connected to the gate terminal through a fourth impedance element and wherein the gate terminal is connected to the source terminal through a fifth impedance element.

15. A method of operating a circuit, the method comprising:

providing a n-channel metal-oxide-semiconductor (NMOS) transistor having a gate terminal, a source terminal and a drain terminal;

receiving, by a signal conversion circuit, a control signal and in response generating a high-side signal;

receiving, by a signal buffer circuit, the high-side signal and in response generating a buffered signal; and receiving, by a drive circuit, the buffered signal and in response generating a gate drive signal causing the NMOS transistor to transition between an on-state and an off-state.

16. The method of claim 15, wherein the signal conversion circuit comprises an NPN transistor having a first collector terminal, a first emitter terminal and a first base terminal.

17. The method of claim 16, wherein the signal conversion circuit further comprises a first impedance element coupled between the first base terminal and the first emitter terminal, a second impedance element coupled between the first emitter terminal and a ground node and a third impedance element coupled in series with the first base terminal.

18. The method of claim 16, wherein the drive circuit is connected to the gate terminal through a fourth impedance element and wherein the gate terminal is connected to the source terminal through a fifth impedance element.

\* \* \* \* \*